United States Patent Office 3,610,125
Patented Oct. 5, 1971

3,610,125 APPARATUS FOR PRODUCING PHOTOLITHOGRAPHIC STRUCTURES, PARTICULARLY ON SEMICONDUCTOR CRYSTAL SURFACES

Wolfgang Touchy, Munich, Germany, assignor to Siemens Aktiengesellschaft, Berlin and Munich, Germany Original application Dec. 6, 1966, Ser. No. 599,577. Divided and this application Oct. 29, 1969, Ser. No. 871,244
Claims priority, application Germany, Dec. 6, 1965, S 100,902
Int. Cl. G03b *29/00*
U.S. Cl. 95—12 1 Claim

ABSTRACT OF THE DISCLOSURE

Apparatus wherein a light-sensitive layer applied to a surface that is to be photolithographically processed is exposed in accordance with an original corresponding to the geometrical form to be produced on the surface, the exposed photosensitive layer is developed so that a copy of the corresponding original, preferably reduced in size, is produced on the layer. The original is traced with a sensing device, and the path taken by the sensing device over the original is used for producing the movement of an exposure mark to describe a path geometrically similar to that of the sensing device on the light-sensitive layer.

Figure 1:
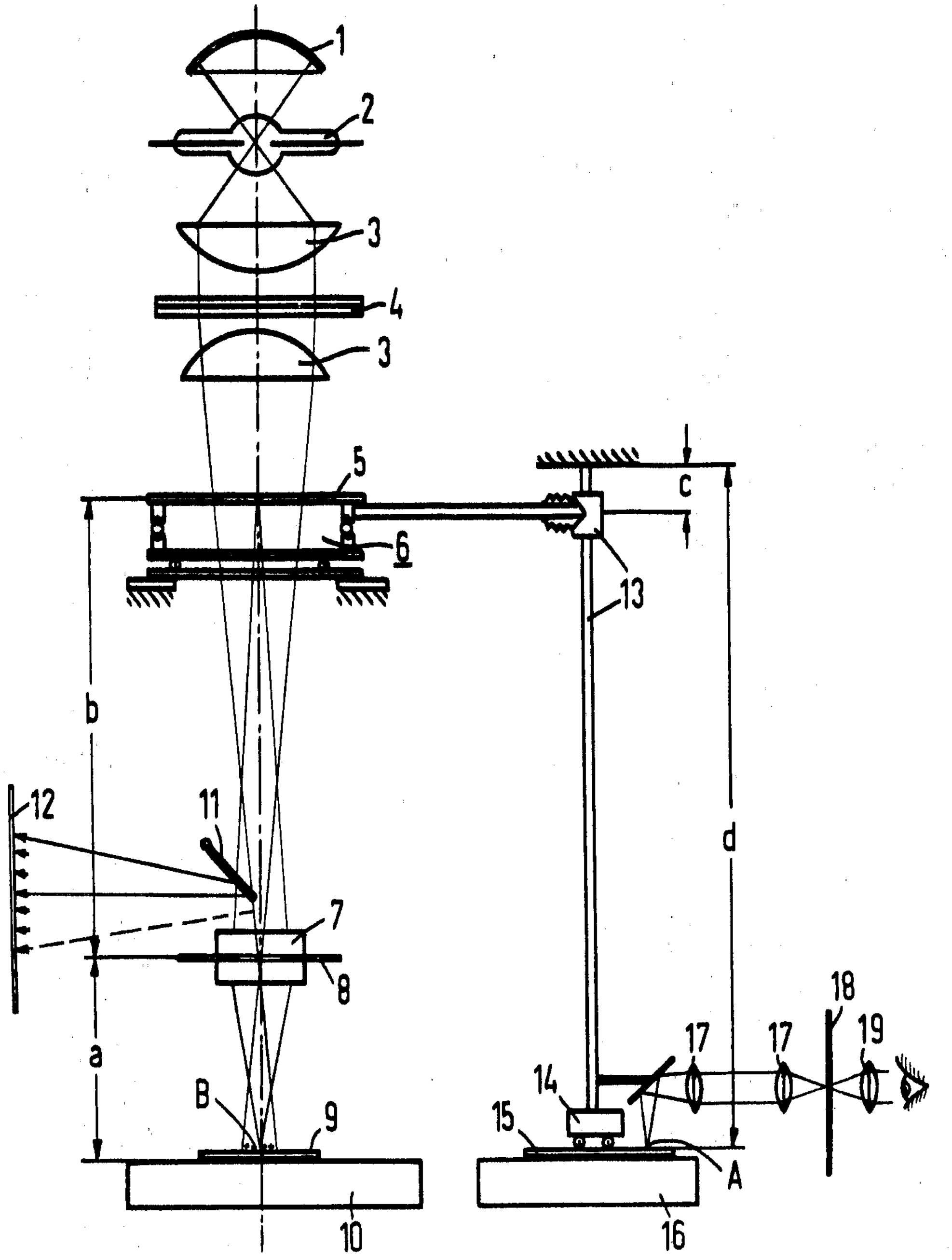

This is a division of application Ser. No. 599,577, filed Dec. 6, 1966.

My invention relates to method and apparatus for producing photolithographic structures, particularly on semiconductor crystal surfaces.

To produce mesa and planar structures necessary for high frequency transistors and integrated networks, the electrodes must be produced with a very small geometry, i.e. relatively small dimensions, and extremely little spacing from the surface of the semiconductor crystal by local etching, deposition, alloying and diffusion processes. In these processes it is necessary to cover with suitable masks or stencils specific regions of the semiconductor crystal surface, which are not to be subject to the respective production process. Such masks are produced by employing known photofinishing or photo-emulsion technology, whereby relatively thin, substantially 0.5 to 1 micron thickness of a photosensitive layer is applied to the semiconductor crystal surface and is exposed according to the desired geometry. By subsequently developing the exposed photosensitive layer, the locations of the semiconductor crystal surface which are necessary for treatment in the production process, are then freed of the photo-emulsion layer.

Since the geometry required for the planar structures are in the order of magnitude of only a few microns, an original of a conveniently manageable scale must be prepared of the desired structure, such as an emitter structure having a strip width that is smaller than 10 microns, for example. The original is projected in much reduced form onto the photo-emulsion located on the semiconductor crystal surface.

Inasmuch as a great number of component systems are produced on a single semiconductor crystal wafer at the same time during the production of the semiconductor elements of planar or mesa structures, it is desirable to effect, simultaneously with the reduction in the size of the original that is being transferred, a multiple reproduction of the desired image.

It is an object of my invention to provide method and apparatus for producing photolithographic structures, particularly on semiconductor crystal surfaces, which are materially improved over the corresponding processes and apparatus of the aformentioned type heretofore employed.

With the foregoing and other objects in view, I provide in accordance with my invention, a method of producing a photolithographic structure applied especially on the surface of a wafer-shaped semiconductor crystal, which comprises exposing a light-sensitive layer applied, in accordance with an original print, sketch, photo or the like corresponding to the geometry which is to be produced, to the surface that is to be photolithographically processed, and thereafter developing the exposed photosensitive layer so that a copy of the corresponding original, preferably reduced in size, is produced on the layer. My invention is further characterized by tracing the original with a sensing device and employing the path taken by the sensing device over the original for producing movement of an exposure mark so that the exposure mark describes a path geometrically similar to that of the sensing device, and one that is especially reduced in geometrical size, on the light-sensitive layer.

In accordance with a further feature of my invention, I pass the sensing device along the contour lines of the original. This is effected by means of a telescopic sight. A motorized carriage steered or controlled by hand serves to provide a uniform sensing or tracing speed. Other sensing devices which are fully automatic can also be used such as, for example, photocells, multipliers, punch cards or program controls.

A further feature in accordance with my invention, is that at least one area of the original enclosed by a contour line is closely traced by the sensing device so that an exposed region proper is produced on the light-sensitive layer.

It is particularly advantageous in accordance with a further feature of my invention to couple the movement of the sensing device with the movement of at least two and even more, if desired, exposure marks, so that the paths traced on the layer that is to be exposed and which are congruent to one another, do not intersect when the original is completely sensed or traced. Accordingly, the movement of the exposure marks is electronically coupled with the movement of the sensing device. It is possible, however, in accordance with my invention, to select a mechanical device whereby the movement of the exposure marks is coupled with the movement of the sensing device by a link mechanism such as a pantograph, for example.

The use of both a punctiform or point-tracing sensing device as well as a punctiform exposure mark has proven to be very expedient because of the sharpness of detail and clear definition of the copied structure obtained thereby.

For better exposure or illumination of a copied diaphragm opening, light produced from a monochromatic source is employed for producing the exposure marks, and the image produced in this manner is projected onto the light-sensitive layer. The wavelength of the light source employed is thus selected so that it is the most suitable for the light-sensitive layer, it being also possible to employ a laser beam.

In accordance with an additional feature of my invention, for producing the movement of the exposure mark, I couple at least the diaphragm opening that is to be copied, with the movement of the sensing device so that the movement of the diaphragm opening, resulting from movement of the sensing device over the original, produces a movement of the image of the diaphragm opening on the light-sensitive layer corresponding to the movement of the sensing device without reducing the definition or sharpness of the image.

The apparatus for carrying out the aforementioned method of my invention comprises coupling means located between a sensing device and an exposure mark of monochromatic light for producing a path of the exposure mark geometrically similar to the path of the sensing device, and preferably reduced in size. In accordance with further features of the apparatus of my invention, the coupling means is of the mechanical type and comprises a pantographic link mechanism.

In accordance with an additional feature of the apparatus of my invention, I provide an illuminating system supplying monochromatic light which is coupled with an optical copying or reproducing system. Between the illuminating system and the copying system there is located a movable aperture diaphragm extending perpendicularly to the main axis of the light beam path, the diaphragm being secured to a cross-feed platform or table coupled with the sensing device.

Other features which are considered as characteristic of the invention are set forth in the appended claim.

Although the invention is illustrated and described herein as method and apparatus for producing photolithographic structures, particularly on semiconductor crystal surfaces, it is nevertheless not intended to be limited to the details shown, since various modifications and structure changes may be made therein without departing from the spirit of the invention and within the scope and range of equivalence of the claims.

Figure 2:
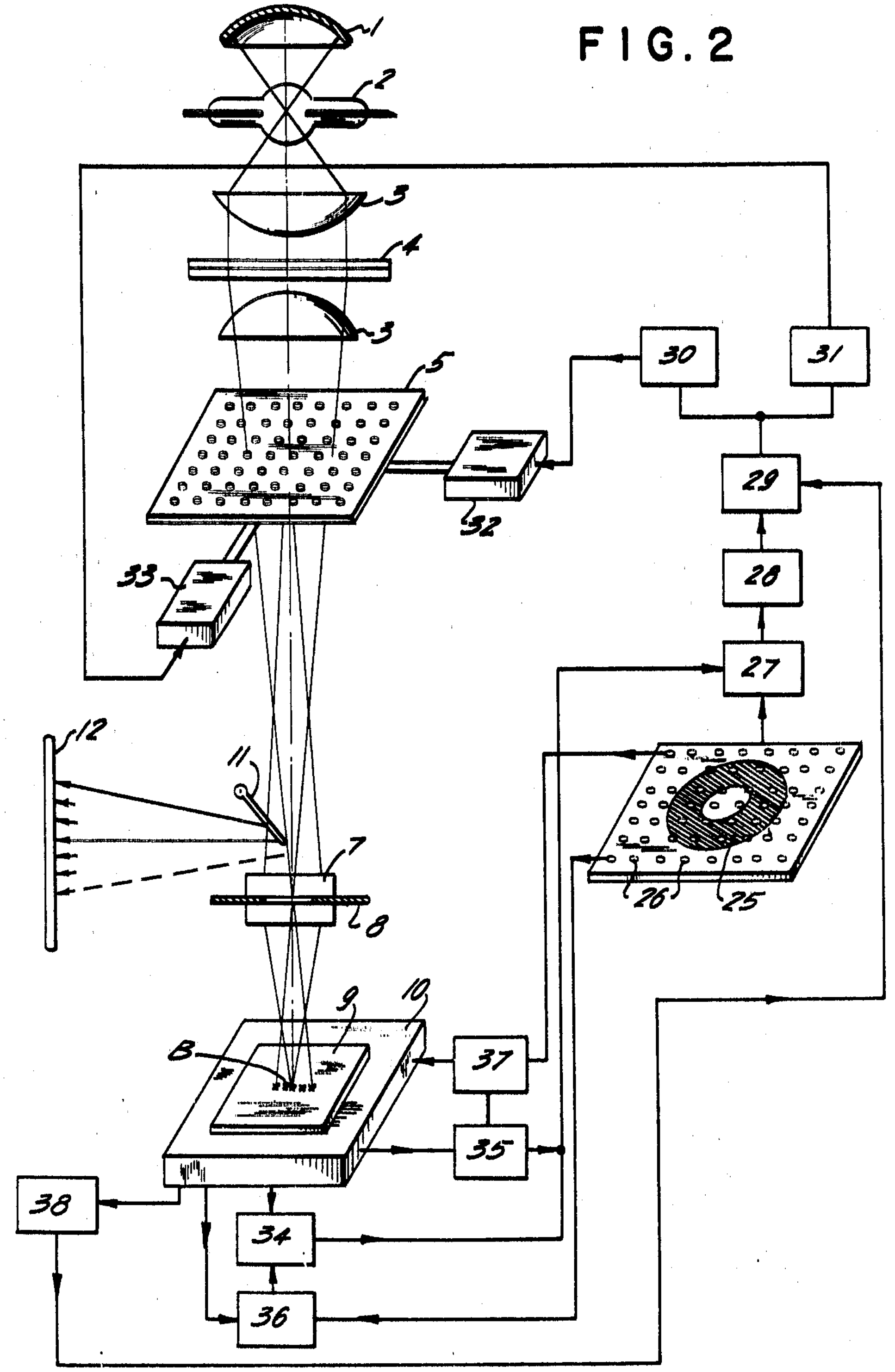

The construction of the apparatus and the method of operation of the invention, however, together with additional objects and advantages thereof will be best understood from the following description when read in connection with the accompanying figures, in which:

FIGS. 1 and 2 are schematic views of two different embodiments of my invention.

Referring to FIG. 1, there is shown an ordinary pencil drawing 15, serving as an original and, for example having a size 500:1 times greater than the desired copy to be produced on the photo-sensitive layer. The pencil drawing 15 is supported on the translucent surface of an illuminating box 16, and the lines on the drawing 15 are traced by a punctiform sensing device A by viewing through a telescopic sight comprising a telecentric lens system 17, a reticule or crosshair screen 18 defining the area having the scaled dimensions of a single exposure mark, and an ocular 19. A motorized carriage 14 steered or controlled by hand serves for producing uniform sensing or tracing speed. Fully automatic sensing devices such as for example, photocells, multipliers, punch cards or program controls can also be employed instead of the motorized carriage 14.

The sensing movement is adjustably effected mechanically by means of a conventional pantographic link mechanism 13, and in transferred to a precision cross-feed platform or table 6 which guides or effects travel of the plate 5 that is provided with holes adavntageously produced by a step-and-repeat process, but which also can be produced by stamping or punching. The sensing or tracing movement can also be transferred by electrical control to the precision table or platform 6. The holes in the plate 5 on the cross-feed platform 6, which are arranged, for example, in a desired raster arrangement which has an area 500:1 times greater than the area of the crystal surface to be processed, are illuminated with monochromatic light from a radiation source 2, such as laser light, if desired, and reproduced through the objective 7. These serve as recording spots or exposure marks B which are registered, in accordance with the arrangement of the holes in the plate 5, on the light-sensitive layer 9 of a photographic plate located on an adjustment table 10. The figure which the motorized carriage 14 traces is thus perfectly reproduced many times simultaneously and reduced in size. A condenser system 3 and a concave mirror 1 serve for obtaining more efficient usage of the radiation source 2 and uniform illumination of the diaphragm opening which is to be copied. The correct exposure time is adjusted by the sensing or tracing speed, the filter combination 4 and the diaphragm 8. If, for example, the contours have been traced with slower sensing or tracing speed, they would be illuminated or exposed with an even stronger lighting in the interior of the image than with higher tracing speeds because of the reduced accuracy requirement. For all regions that are not to be exposed or illuminated, it is possible to produce structures which are virtually independent of the size of the recording spots in the same manner as one can produce only thick black areas with a thick black pencil yet, however, be able thereby to define therebetween very small white areas, such as for example, white areas representing slots, bridges or waved lines.

When it is necessary to adjust successive masks to a given geometry of the same raster, the images of the holes are employed as adjustment points in a null setting of the motorized carriage 14, and the mask carrier, i.e. the semiconductor crystal, for example, is precisely set and adjusted on the adjustment table 10 by means of a flap mirror or pivotable plane mirror 11. The image 12 can accordingly be examined or observed with a microscope for obtaining very great accuracy and automated with servomotors and secondary electron multiplying devices in heretofore known manner.

In FIG. 2, there is shown an embodiment of the apparatus employed for carrying out the method of my invention wherein the coupling of the movement of the exposure marks with the movement of the tracing or sensing device is effected electronically. A program transmitter 25, 26 is provided, consisting of a plate divided into coordinates, each of which is represented by a photocell. The pattern 25, shown by the shaded area in FIG. 2, is placed on the coordinate plate and an entire program transmitter is illuminated. A numerical control 28 is switched on through an on-off switch 27 for cutting the photocells sequentially into the circuit and divides them up into $x$ and $y$ numerical values. A speed control 29 counts off the numerical values at a speed corresponding to the exposure to illumination, and pulse transmitters 30 and 31 convert those values to $x$ and $y$ pulses fed to the step motors 32 and 33, respectively.

Control devices 34 and 35 serve to feed back errors of the step motors to the on-off switch. Adjustment motors 36 and 37 serve to bring the image B and the pattern 25 into the same orientation in accordance with suitable adjustment marks. An illumination control 38 provides for accommodating the velocity of feed or travel of the perforated diaphragm 5, or of the points of light, to the light-sensitive layer 9. The remaining reference numerals in FIG. 2 correspond to and identify the same features as in the embodiment of FIG. 1.

By exchanging the plate 5, any desired raster arrangement constituting a single system can be formed. For large, rough systems, it is desirable to increase the diameter of the holes or to choose a smaller optical reduction ratio ($a$:$b$).

By means of the method of my invention, there is provided a variable, rapid and inexpensive means of forming the finest geometries as etching masks that are repeated many times or less often repeated, covering a very large surface and nevertheless having very fine substructures, as for example integrated networks, without requiring an accurate drawing to be produced to a scale of 1000:1 and without requiring various difficult reduction stages with retouching operations.

A further advantage of my invention is that this one-step method can be provided so that it is fully automatic and is very readily accommodated to large and small, and coarse and fine structures. Even the finest structures can be produced smaller than the resolution power of the reproducing objective would permit in the form of a closed image. With special objectives, holes of 2$\mu$ diameter can be copied on a surface region of 25 mm. diameter with the aid of the method of my invention.

My invention also provides the possibility of producing simultaneously on a single silicon monocrystalline wafer, having a diameter of 2.5 cm., substantially a thousand systems having emitter strips of 6$\mu$ width. The spacing of the subsequently employed geometry is accordingly dependent upon the sharpness or definition of resolution of the objective. For this purpose, complete etching masks required in planar technology can be produced from photo-sensitive material to provide windows in the oxide skin or outer layer of the silicon surface for the purpose of in-diffusion and metallizing. Furthermore, the method of my invention can be employed in a very advantageous manner for producing printed circuits.

A total reduction ratio of the size of the original to the size of the final image of 500:1 is achieved when the proportion of the optical reduction ratio $a:b=1:5$ and a mechanical reduction ratio $c:d=1:100$ is selected. (Note the corresponding arrows indicating the foregoing relative dimensions in the figure.)

Following is an example of the method of my invention:

The diameter of the holes in the plate 5 was 30$\mu$, the raster was 2.5 mm. in length. With an optical reduction ratio $a:b=1:5$, an exposure mark of 6$\mu$ diameter was produced on the light-sensitive layer 9 and the raster was 0.5 mm. on a surface region of 25 mm. diameter. Accordingly, the number of systems provided on a silicon monocrystalline wafer of 25 mm. diameter was 1000 in number.

I claim:

1. Apparatus for producing a photolithographic structure on a solid surface, comprising a tracing device steerable in a given path over an original corresponding to the geometrical form to be produced on a surface to be photolithographically processed, means for producing an exposure mark of monochromatic light, and means coupling said tracing device and said exposure mark-producing means for moving said exposure mark, simultaneously with the steered movement of said tracing device, along a path on a photosensitive layer applied to the surface and geometrically similar to the path traced by said tracing device whereby said photosensitive layer is exposed to the moving exposure mark, said means for producing an exposure mark comprising an illuminating system supplying a beam of monochromatic light, an optical copying system coupled to said illuminating system, and a movable aperture diaphragm extending perpendicularly to the main axis of said light beam intermediate said illuminating system and said optical copying system, said diaphragm being secured to a cross-feed platform operatively connected to said tracing device.

References Cited

UNITED STATES PATENTS 2,829,556 4/1958 Carter ............ 355—46 X

SAMUEL S. MATTHEWS, Primary Examiner

R. P. GREINER, Assistant Examiner

U.S. Cl. X.R.

355—40, 46